(12) United States Patent
Shinagawa et al.

(10) Patent No.: US 11,869,756 B2
(45) Date of Patent: Jan. 9, 2024

(54) VIRTUAL METROLOGY ENHANCED PLASMA PROCESS OPTIMIZATION METHOD

(71) Applicant: Tokyo Electron Limited, Tokyo (JP)

(72) Inventors: Jun Shinagawa, Fremont, CA (US); Toshihiro Kitao, Austin, TX (US); Atsushi Suzuki, Austin, TX (US); Megan Wooley, Austin, TX (US); Alok Ranjan, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 267 days.

(21) Appl. No.: 17/350,439

(22) Filed: Jun. 17, 2021

(65) Prior Publication Data

US 2022/0406580 A1  Dec. 22, 2022

(51) Int. Cl.
*G06F 30/398* (2020.01)
*H01J 37/32* (2006.01)

(52) U.S. Cl.
CPC ...... *H01J 37/32926* (2013.01); *G06F 30/398* (2020.01); *H01J 2237/334* (2013.01)

(58) Field of Classification Search
CPC ........ G06F 30/39; G06F 30/367; G06F 30/20; G06F 30/398; G06F 30/23; G06F 2119/12; G06F 2119/18; G06F 2111/08; G06F 2111/10; G06F 30/392; G06F 2115/06; G06F 2119/08; G06F 30/333; G06F 3/04815; G06F 3/04847; G06F 17/10; G06F 30/30; G06F 17/14; G06F 18/214; G06F 18/217; G06F 18/24; G06F 2111/06; G06F 2119/22; G06F 30/27; G06F 30/33; G06F 30/3308; G03F 1/70; G03F 1/36; G03F 7/705; G03F 1/80; G03F 7/70625;

(Continued)

(56) References Cited

U.S. PATENT DOCUMENTS

| | | | | |
|---|---|---|---|---|
| 2019/0311083 A1* | 10/2019 | Feng | ............ | G03F 1/78 |
| 2020/0356711 A1* | 11/2020 | Egan | ............ | G06F 30/398 |
| 2021/0055699 A1* | 2/2021 | Agarwal | ............ | G01N 23/201 |

OTHER PUBLICATIONS

Bonnecaze, et al.; Simulation and Optimization of Etch on Flexible Substrates for Roll-To-Roll Processing; SandBox Semiconductor, Inc.; Feb. 27, 2019; 22 Pages.

(Continued)

*Primary Examiner* — Binh C Tat
(74) *Attorney, Agent, or Firm* — Oblon, McClelland, Maier & Neustadt, L.L.P.

(57) ABSTRACT

A method of optimizing a recipe for a plasma process includes (a) building a virtual metrology (VM) model that predicts a wafer characteristic resulting from the plasma process based on a plasma parameter and (b) building a control model that describes a relationship between the plasma parameter and a recipe parameter. (c) The wafer characteristic is measured after performing the plasma process according to the recipe. (d) Whether the wafer characteristic is within a predetermined range is determined. (e) The VM model and the control model are calibrated based on the wafer characteristic. (f) The recipe is optimized by updating the plasma parameter based on the wafer characteristic using the VM model and updating the recipe parameter based on the plasma parameter using the control model. (c), (d), (e) and (f) are repeated until the wafer characteristic is within the predetermined range.

20 Claims, 5 Drawing Sheets

(58) Field of Classification Search
CPC ............. G03F 7/70633; G03F 7/70033; G03F 7/70616; G03F 7/70525; G03F 1/84; G03F 7/00; G03F 1/78; G03F 1/86; G03F 7/70516; G03F 7/0002; G03F 7/70558; G03F 7/0041; G03F 7/2002; G03F 7/2004; G03F 7/70008; G03F 7/70066; G03F 7/70141; G03F 7/70441; G03F 7/70466; G03F 7/70483; G03F 7/70508; G03F 7/70533; G03F 1/26; G03F 7/2037; G03F 7/26; G03F 7/7065; G03F 7/70666; H01L 21/7685; H01L 21/76254; H01L 21/76855; H05H 1/30; H05H 1/46
USPC ...................................... 716/50–56, 132–136
See application file for complete search history.

(56) References Cited

OTHER PUBLICATIONS

Chopra, et al. ; A method to accelerate creation of plasma etch recipes using physics and Bayesian statistics ; Advanced Etch Technology for Nanopatterning VI ; Proc. Of SPIE vol. 101490X ; 2017 ; 9 Pages.
Chopra, et al. ; A Model-Based, Bayesian Approach to the CF4/Ar Etch of SiO2 ; Design-Process-Technology Co-optimization for Manufacturability XII ; Proc. Of Spie vol. 10588 ; 11 Pages.

\* cited by examiner

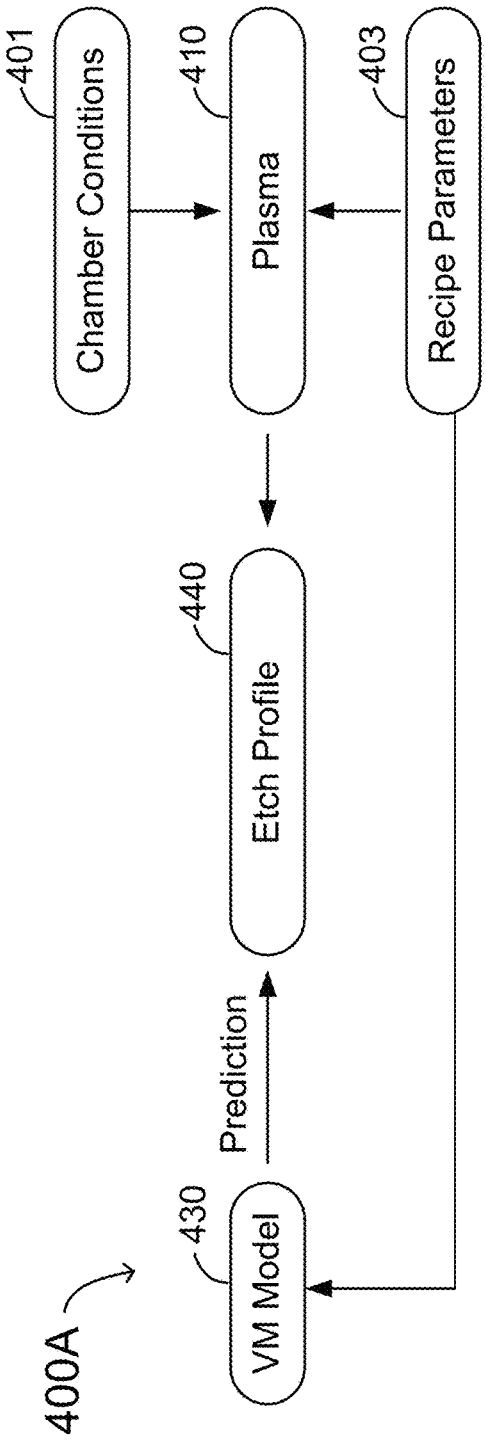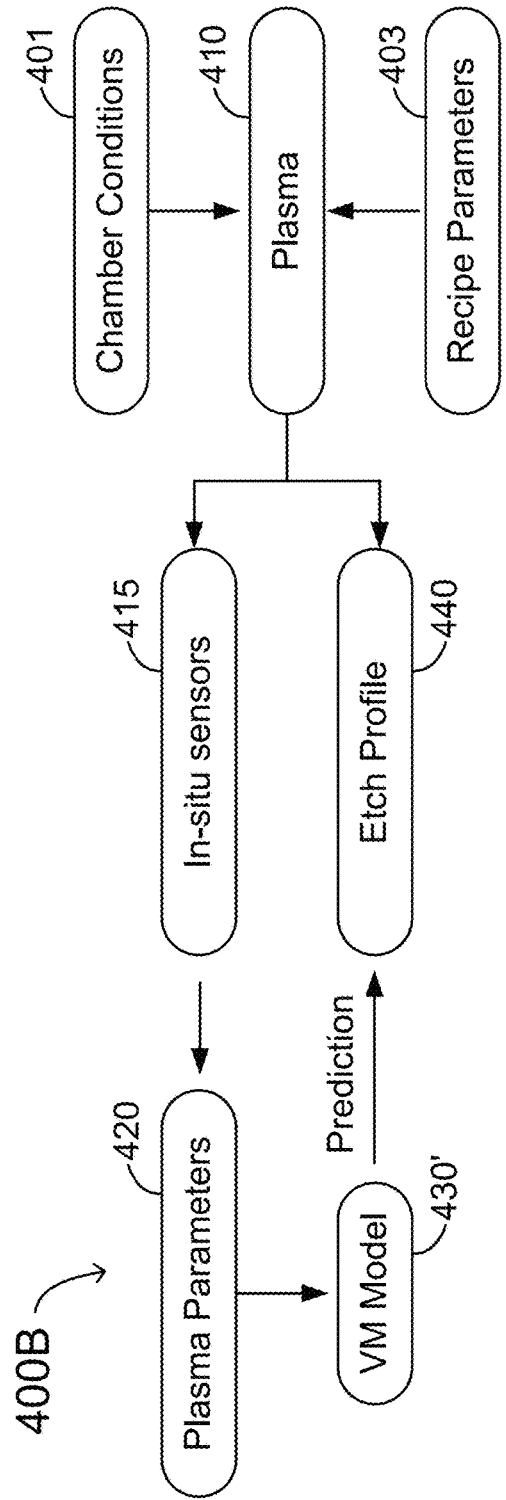
Figure 4A
Figure 4B

VIRTUAL METROLOGY ENHANCED PLASMA PROCESS OPTIMIZATION METHOD

FIELD OF THE INVENTION

This disclosure relates generally to semiconductor fabrication and, more particularly, to optimizing a recipe for a plasma process.

BACKGROUND

Plasma processing plays a vital role in material deposition and removal in the production of semiconductor chips. Typical examples include plasma-assisted chemical vapor deposition, plasma-assisted physical vapor deposition, plasma etching, plasma cleaning, etc. In a plasma process, a remote plasma source generates an ionized gas which contains ions, electrons, radicals and neutral particles. Precise control of the ionized gas in a plasma chamber is crucial to various semiconductor fabrication techniques, such as etching, deposition and ashing. Optimizing plasma recipes is thus important to achieve such good control. Historically, plasma sources used in the semiconductor industry were originally developed by trial and error due to a lack of understanding of related plasma processes. Ergo, many plasma recipes were also developed by trial and error.

SUMMARY

The present disclosure relates to a method of optimizing a recipe for a plasma process.

An aspect (1) includes a method of optimizing a recipe for a plasma process. The method includes (a) building a virtual metrology (VM) model that predicts a wafer characteristic resulting from the plasma process based on a plasma parameter. (b) A control model is built that describes a relationship between the plasma parameter and a recipe parameter. (c) The wafer characteristic is measured after performing the plasma process according to the recipe. (d) Whether the wafer characteristic is within a predetermined range is determined. (e) The VM model and the control model are calibrated based on the wafer characteristic. (f) The recipe is optimized by updating the plasma parameter based on the wafer characteristic using the VM model and updating the recipe parameter based on the plasma parameter using the control model. (c), (d), (e) and (f) are repeated until the wafer characteristic is within the predetermined range.

An aspect (2) includes the method of aspect (1), wherein determining whether the wafer characteristic is within the predetermined range further includes determining whether $\Delta WC$ exceeds a pre-determined threshold. $\Delta WC = WC_{Measured} - WC_{target}$. $WC_{Measured}$ is the wafer characteristic measured after performing the plasma process, and $WC_{Target}$ is a target value of the wafer characteristic.

An aspect (3) includes the method of aspect (2), wherein optimizing the recipe further includes determining $\Delta PP$ using the VM model. $\Delta PP = PP_{Updated} - PP_{Current}$. $PP_{Updated}$ is an updated value of the plasma parameter based on $WC_{Measured}$ using the VM model, and $PP_{Current}$ is a current value of the plasma parameter.

An aspect (4) includes the method of aspect (3), wherein optimizing the recipe further includes determining $\Delta RP$ using the control model. $\Delta RP = RP_{Updated} - RP_{Current}$. $RP_{Updated}$ is an updated value of the recipe parameter based on $PP_{Updated}$ using the control model, and $RP_{Current}$ is a current value of the recipe parameter.

An aspect (5) includes the method of aspect (1), wherein calibrating the control model includes performing the plasma process on a dummy wafer according to the recipe. The plasma parameter is recorded while performing the plasma process on the dummy wafer according to the recipe. The control model is updated based on the plasma parameter recorded.

An aspect (6) includes the method of aspect (1), wherein the control model is calibrated periodically.

An aspect (7) includes the method of aspect (1), wherein optimizing the recipe includes performing Bayesian optimization.

An aspect (8) includes the method of aspect (1), wherein building the VM model includes performing a linear regression.

An aspect (9) includes the method of aspect (1), further including measuring the plasma parameter using an in-situ sensor in a plasma tool.

An aspect (10) includes the method of aspect (1), wherein the plasma process includes at least one of an etching process, a chemical vapor deposition process, a physical vapor deposition process or an atomic layer deposition process.

An aspect (11) includes the method of aspect (1), wherein the wafer characteristic includes at least one of a critical dimension (CD), an etch rate (ER), an amount of remaining mask material, a film thickness, a film chemical composition, a film deposition rate, a film reflectivity or a film absorbance.

An aspect (12) includes the method of aspect (1), wherein the plasma parameter includes at least one of gas pressure, gas temperature, species concentration, etchant flux, deposition flux, by-product re-deposition rate, a sticking coefficient, ion flux or ion energy.

An aspect (13) includes the method of aspect (1), wherein the recipe parameter includes at least one of gas flow rate, plasma chemistry, microwave power or electrostatic chuck temperature.

An aspect (14) includes the method of aspect (1), wherein optimizing one wafer characteristic that results from the plasma process automatically leads to optimization of another wafer characteristic that results from the plasma process.

An aspect (15) includes the method of aspect (1), wherein the plasma parameter depends on the recipe parameter and a chamber condition.

An aspect (16) includes the method of aspect (15), wherein the chamber condition includes at least one of a surface condition and age of a component of a plasma tool.

An aspect (17) includes the method of aspect (16), wherein the surface condition includes species coverage on a chamber wall, and the age of the component of the plasma tool includes chamber age.

An aspect (18) includes the method of aspect (1), wherein the plasma process is an etching process. The wafer characteristic measured is CD. The plasma parameter includes neutral density of Cl. The recipe parameter includes a flow rate of $Cl_2$.

An aspect (19) includes the method of aspect (18), wherein the VM model predicts CD using the neutral density of Cl, and the control model describes a relationship between the neutral density of Cl and the flow rate of $Cl_2$.

An aspect (20) includes the method of aspect (19), wherein optimizing CD automatically leads to optimization of ER.

Note that this summary section does not specify every embodiment and/or incrementally novel aspect of the present disclosure or claimed invention. Instead, this summary only provides a preliminary discussion of different embodiments and corresponding points of novelty. For additional details and/or possible perspectives of the invention and embodiments, the reader is directed to the Detailed Description section and corresponding figures of the present disclosure as further discussed below.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be increased or reduced for clarity of discussion.

FIG. 4A shows a diagram of building a virtual metrology (VM) model without plasma parameters in related examples.

FIG. 4B shows a diagram of building a VM model with plasma parameters in accordance with some embodiments of the present disclosure.

DETAILED DESCRIPTION

Figure 1:
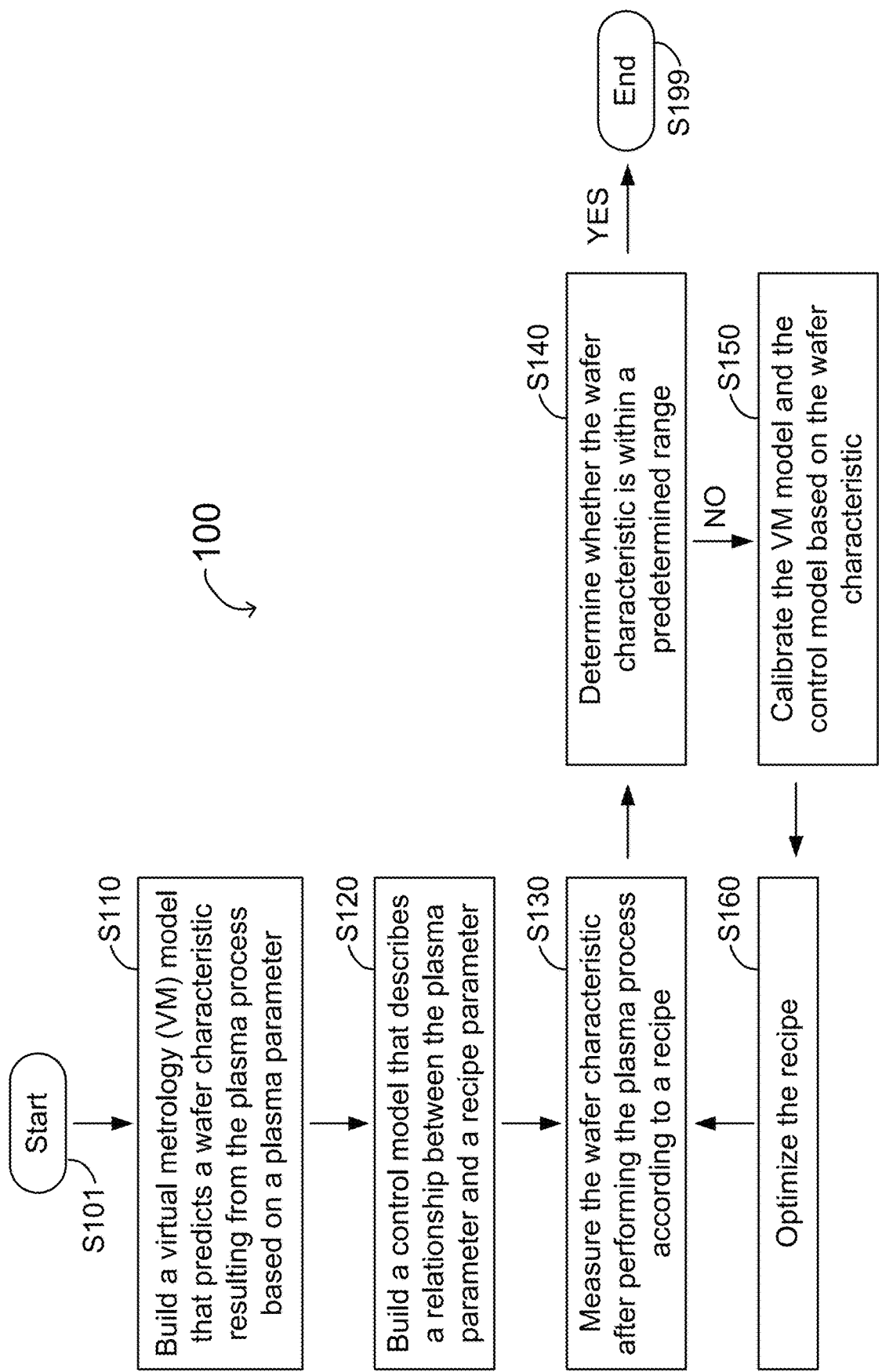
FIG. 1 shows a diagram of optimizing a recipe for a plasma process, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

As noted in the Background, developing and optimizing plasma process recipes is one of the most important yet challenging semiconductor wafer fabrication processes, requiring a large amount of time and resources. Plasma process recipes consist of a large number of process variables and are most often developed by iterative trial-and-error experiments to meet process specification requirements. Furthermore, challenges lie in the need to simultaneously optimize numerous process specifications such as cross-sectional profiles, uniformity, etc., among which trade-offs often exist.

Techniques herein reduce the number of iterations for trial-and-error experiments by enabling multi-objective optimization guided by process recipe parameter sensitivities extracted from process data and by process result predictions by interpolation and extrapolation with process models. Such multi-objective optimization with a virtual metrology (VM) model utilizes in-situ sensor data to take into account chamber conditions, which are missing in related examples.

Particularly, patents (U.S. Ser. No. 10/572,697B2, U.S. Ser. No. 10/386,828B2, U.S. Ser. No. 10/303,830B2 and U.S. Pat. No. 9,466,466B1) of Lam Research Corporation disclose techniques that perform profile simulation optimized by a reflectometer. Therein, unknown plasma parameters (e.g., ion flux, IAD, neutral flux, etc.) and surface properties (e.g., sticking coefficients, reaction rate, etc.) are tuned by reflectometer measurements so that less SEM measurement is required. However, profile simulator does not take into consideration chamber conditions such as part age and surface conditions that can impact unknown plasma parameters and/or surface properties. Moreover, how to link recipe parameters to profile simulator input is unclear.

SandBox Semiconductor Incorporated developed global plasma and surface reaction models by using Bayesian optimization including techniques such as the Monte-Carlo method revealed in their SPIE publications, "A model-based, Bayesian approach to the $CF_4/Ar$ etch of $SiO_2$" and "Simulation and optimization of etch on flexible substrate for roll-to-roll processing", the entire content of each of which is incorporated herein by reference. Plasma parameters are estimated by global models with chamber dimensions and recipe conditions. Relatively small samples are required, and fast computation is achieved. Unknown parameters can be calibrated by Bayesian inference. Nevertheless, chamber condition impacts are not considered because chamber conditions are not directly measured. Besides, surface reaction rate constants need to be calibrated by experimental data. In addition, it is less accurate because of the assumptions which global plasma models are based on. It is also less flexible to predict non-linear responses beyond what a physical model can describe, especially when data size grows.

In a patent "Computer, method for determining processing control parameter, substitute sample, measurement system, and measurement method" (US20190064755A1) by Hitachi Limited, recipe parameters are optimized by the machine learning model tuned with in-situ scatterometry data. Its easiness to implement notwithstanding, chamber condition impacts are not taken into consideration and chamber condition variations can cause errors which impact the model that relates recipe parameters to scatterometry data. Additionally, large samples are required for high accuracy.

In the present disclosure, a profile is estimated by a virtual metrology (VM) model with measured plasma parameters. The VM model can be constructed either with a surface reaction model (i.e. a physics model) or the ML model. Very importantly, chamber conditions are described by plasma parameters which are directly measured by in-situ sensors in a plasma chamber. Hence, chamber conditions are integrated into the VM model. What is more, only a relatively small sample size is required for techniques herein.

Figure 3A:
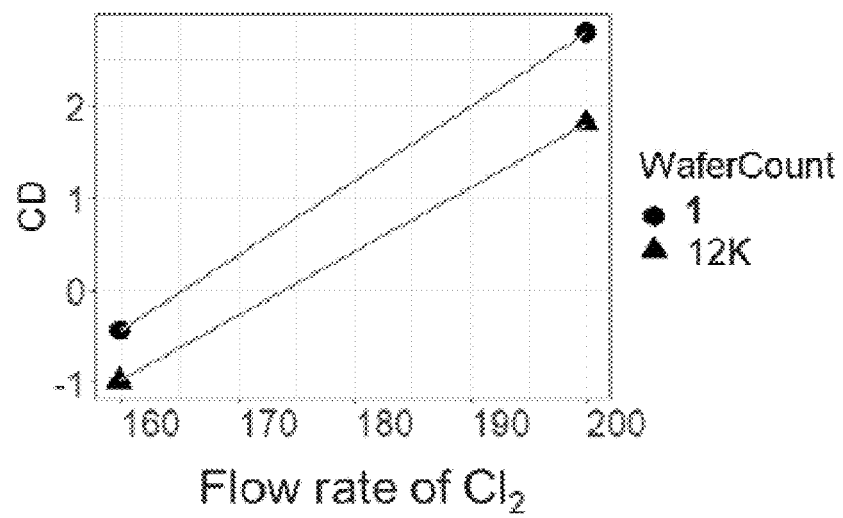
FIGS. 3A and 3B show dependence of a wafer characteristic on a recipe parameter and on a plasma parameter, respectively, in accordance with some embodiments of the present disclosure.
Figure 3B:
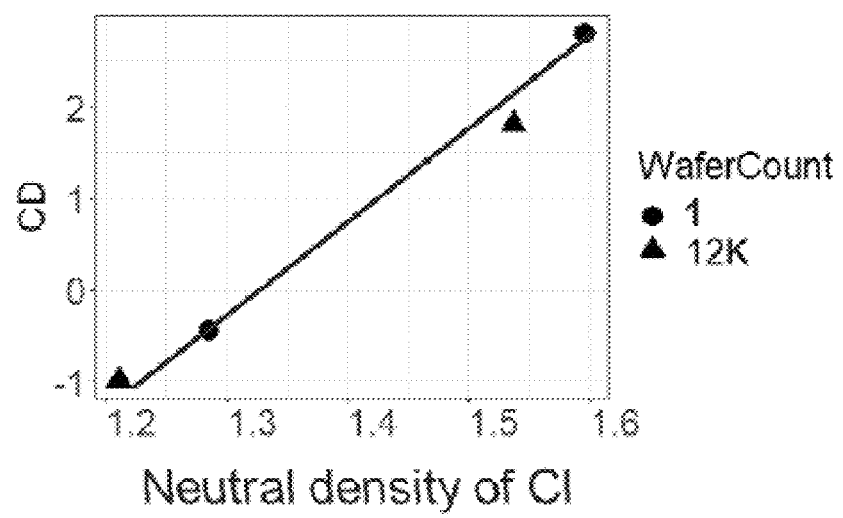

FIGS. 3A and 3B show dependence of a wafer characteristic on a recipe parameter and on a plasma parameter, respectively, in accordance with some embodiments of the present disclosure. The wafer characteristic includes at least one of a critical dimension (CD), an etch rate (ER), a film thickness, a film deposition rate, an amount of remaining mask material or the like.

In the example of FIG. 3A, CD is shown as a function of a flow rate of $Cl_2$ for different wafers. Herein, $Cl_2$ is used as part of a plasma source for a plasma etching process. Wafer 1 has a WaferCount of 1, meaning that Wafer 1 was the first wafer of the plasma etching process. The plasma etching process was then repeated for 11,999 more wafers. Wafer 12k has a WaferCount of 12k, meaning that Wafer 12k was the twelve thousandth wafer. WaferCount is thus a measure of chamber age: Wafer 1 corresponds to initial chamber conditions while Wafer 12k corresponds to final chamber conditions.

Data for Wafer 1 and Wafer 12k are plotted in FIG. 3A. A plot for Wafer 12k manifests a significant deviation from a plot for Wafer 1, indicating that the final chamber conditions were different from the initial chamber conditions. In other words, chamber conditions had been drifting. As can be appreciated, the chamber conditions would have continued to drift if the plasma etching process had been repeatedly performed on more wafers. Hence, describing CD as a function of the flow rate of $Cl_2$ is subject to chamber condition variations over time (age of consumable parts in this case). Generally speaking, such chamber condition variations add significant errors to models constructed with recipe parameters only.

In FIG. 3B, data for Wafer 1 and Wafer 12k are presented in a different way. Instead of using a recipe parameter (e.g. the flow rate of $Cl_2$) as the x axis, a plasma parameter (e.g. neutral density of CO is investigated herein. In contrast to FIG. 3A, the data for Wafer 1 and Wafer 12k can be expressed with a single plot in FIG. 3B. The neutral density of Cl describes a fundamental state of the plasma process. Ergo, dependence of CD on the neutral density of Cl is not affected by the chamber condition variations mentioned above. For example, Cl coverage on a chamber wall may change over time as Cl attaches (or sticks) to the chamber wall and/or detaches therefrom. As a result, a same flow rate of $Cl_2$ can lead to different neutral densities of Cl in a chamber at different times. Nevertheless, changing the Cl coverage on the chamber wall does not alter a surface reaction model of the plasma process, thus not affecting the dependence of CD on the neutral density of Cl. Note that the surface reaction model can predict CD as a function of chemical and physical properties of plasma, such as the neutral density of Cl. One or more of the chemical or physical properties of plasma may be impacted by surface coverage of Cl.

To understand the distinction between FIG. 3A and FIG. 3B from another perspective, plasma parameters depend on recipe parameters and chamber conditions. In order to keep values of plasma parameters unchanged, recipe parameters will have to be adjusted in the case of drifted chamber conditions. Therefore, VM models constructed with plasma parameters are robust against chamber condition variations which are reflected in plasma parameter variations.

FIG. 4A shows a diagram of a method 400A for constructing a VM model without plasma parameters in related examples. As illustrated, plasma 410 depends on both chamber conditions 401 and recipe parameters 403. In a plasma etching process, for example, the plasma 410 will result in an etch profile 440. Meanwhile, a VM model 430 is constructed based on the recipe parameters 403. The VM model 430 will be used to perform some prediction and generate another etch profile 440. Initially, the etch profile 440 generated by the VM model 430 is very close to the etch profile 440 measured after the plasma process. Over time, however, the VM model 430 may be subject to chamber condition variations and will thus no longer be valid. As a result, the etch profile 440 generated by the VM model 430 may deviate significantly from the etch profile 440 measured.

FIG. 4B shows a diagram of another method 400B for constructing a VM model with plasma parameters in accordance with some embodiments of the present disclosure. Similarly, the plasma 410 depends on both the chamber conditions 401 and the recipe parameters 403 and results in the etch profile 440. In order to construct a VM model 430', in-situ sensors 415 are leveraged to measure plasma parameters 420 for the plasma etching process. Then, the VM model 430' is used to perform some prediction and generate an etch profile 440. Because the plasma parameters 420 are integrated into the VM model 430', the VM model 430' is robust against chamber condition variations. Consequently, the etch profile 440 generated by the VM model 430' can remain acceptably close to the etch profile 440 measured as time goes on.

In some embodiments, the etch profile 440 in FIGS. 4A and 4B are replaced by other wafer characteristics, such as CD, ER and/or the like. In some embodiments, the plasma 410 is utilized for other plasma processes, such as plasma-assisted chemical vapor deposition. Accordingly, the wafer characteristics of interest can include film thickness, film chemical composition, film deposition rate, film reflectivity, film absorbance and/or the like. In some embodiments, the VM models 430 and 430' are constructed using techniques disclosed in our previous patent application U.S. Ser. No. 17/025,651.

Figure 5:
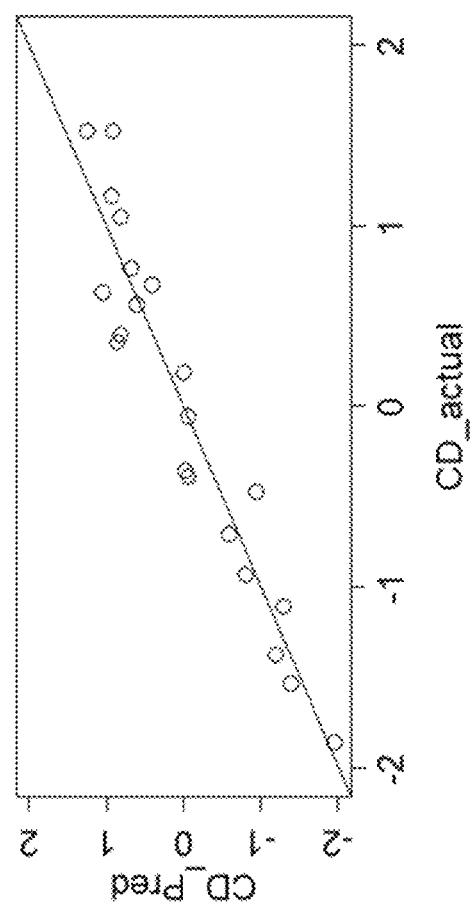
FIG. 5 shows a comparison between a wafer characteristic measured and the wafer characteristic predicted by a VM model constructed with plasma parameters, in accordance with some embodiments of the present disclosure.

FIG. 5 shows a comparison between a wafer characteristic measured and the wafer characteristic predicted by a VM model constructed with plasma parameters, in accordance with some embodiments of the present disclosure. Herein, CD_pred refers to CD predicted by the VM model while CD_actual refers to CD measured after the plasma process. As shown, CD_pred is in good agreement with CD_actual, with an RMSE=0.3, suggesting the validity of the VM model constructed with plasma parameters. Additionally, the VM model in FIG. 5 was constructed in accordance with the method revealed in our previous patent application U.S. Ser. No. 17/025,651.

FIG. 1 shows a diagram of a method 100 for optimizing a recipe for a plasma process, in accordance with some embodiments of the present disclosure. The method 100 starts with Step S110 by building a virtual metrology (VM) model that predicts a wafer characteristic resulting from the plasma process based on a plasma parameter. The VM model takes plasma parameters into consideration. In some embodiments, the VM model is built according to our previous patent application U.S. Ser. No. 17/025,651. In some embodiments, the VM model is built by performing a linear regression or other suitable regression analysis. In some embodiments, the VM model corresponds to the VM model 430' in FIG. 4B.

In some embodiments, the plasma process includes at least one of an etching process, a chemical vapor deposition process, a physical vapor deposition process, an atomic layer deposition process and/or the like. In some embodiments, the wafer characteristic includes at least one of a critical dimension (CD), an etch rate (ER), an amount of remaining mask material, a film thickness, a film chemical composition, a film deposition rate, a film reflectivity, a film absorbance and/or the like. In some embodiments, the plasma parameter includes at least one of gas pressure, gas temperature, species concentration, etchant flux, deposition flux, by-product re-deposition rate, a sticking coefficient, ion flux, ion energy and/or the like. More often than not, multiple wafer characteristics are of interest in a semiconductor fabrication process. Accordingly, multiple VM models are developed, and each VM model may entail multiple plasma parameters.

In a primary embodiment, the plasma process is a plasma etching process, which uses $Cl_2$ to etch Si. Wafer characteristics, including CD and ER, are measured so VM models for CD and ER are built. The VM models predict CD and ER based on neutral density of Cl, which is a plasma parameter. Other plasma parameters, such as ion density of $Cl^-$, ion density of $O^{2-}$, neutral density of O, gas pressure, gas temperature, ion-assisted deposition rate and the like, can also be incorporated into the VM models.

The method 100 then proceeds to Step S120 where a control model is built that describes a relationship between the plasma parameter and a recipe parameter. As has been mentioned before, plasma parameters typically depend on recipe parameters and chamber conditions. As a result, the control model(s) is(are) calibrated periodically. In some embodiments, the recipe parameter includes at least one of gas flow rate, plasma chemistry, microwave power, electrostatic chuck temperature and/or the like. In some embodiments, the chamber conditions include at least one of a surface condition (e.g. species coverage on a chamber wall), age of a component of a plasma tool (e.g. chamber age) and/or the like. In some embodiments, a plurality of control models is built for a plurality of plasma parameters and a plurality of recipe parameters.

In the primary embodiment, a first control model is built to describe a relationship between the neutral density of Cl and a flow rate of $Cl_2$. The first control model may also include other recipe parameters (e.g. gas pressure, gas temperature, etc.). The first control model may further include chamber conditions (e.g. Cl coverage on a chamber wall, chamber size, chamber shape, etc.). Similarly, a second control model can be constructed so as to describe how the ion-assisted deposition rate depends on the flow rate of $Cl_2$ and other recipe parameters in addition to chamber conditions. Further, other control models can also be built, depending on the specific chemistry and physics of the plasma process.

At Step S130, the wafer characteristic is measured after performing the plasma process according to the recipe. In some embodiments, the plasma process is performed on a single wafer, and the wafer characteristic of the single wafer is measured. In other embodiments, the plasma process is performed on a plurality of wafers. In one example, the wafer characteristic of the plurality of wafers is measured and averaged. In another example, the wafer characteristic is only measured for one or more representative wafers of the plurality of wafers.

The method 100 then proceeds to Step S140 by determining whether the wafer characteristic is within a predetermined range. In one embodiment, the wafer characteristic is directly compared with the predetermined range. If the wafer characteristic is within the predetermined range, the method 100 then proceeds to Step S199. Therein, the recipe is considered to have been fully optimized so the method 100 comes to an end. If the wafer characteristic is not within the predetermined range, the method 100 then proceeds to Step S150, which will be explained in detail later.

In another embodiment, in order to determine whether the wafer characteristic is within the predetermined range, $\Delta WC$ is calculated first: $\Delta WC = WC_{Measured} - WC_{target}$. Herein, $WC_{Measured}$ is the wafer characteristic measured after performing the plasma process, and $WC_{Target}$ is a target value of the wafer characteristic. Subsequently, $\Delta WC$ is compared with a pre-determined threshold. If $\Delta WC$ does not exceed the pre-determined threshold, the method 100 then proceeds to Step S199. Otherwise, the method 100 proceeds to Step S150.

At Step S150, the VM model and the control model are calibrated based on the wafer characteristic. The fact that the wafer characteristic is not within the predetermined range suggests that at least one of the VM model(s) or the control model(s) is no longer valid. Thus, the wafer characteristic will be used as new data for calibration. In some embodiments, in order to calibrate the control model, the plasma process is performed on a dummy wafer according to the recipe. The plasma parameter(s) is(are) recorded while the plasma process is performed. The control model is then updated based on the plasma parameter recorded. Such calibration can be executed periodically or as often as needed. In some embodiments, the VM model is calibrated by common optimization techniques such as generic algorithm, Bayesian optimization, etc.

At Step S160, the recipe is optimized by updating the plasma parameter based on the wafer characteristic using the VM model and updating the recipe parameter based on the plasma parameter using the control model. In some embodiments, Bayesian optimization is performed. Using a physical model, Bayesian inference can be used to calibrate unknown parameters (e.g. plasma parameters and surface properties) of a process model. In the primary embodiment, the VM model for CD and the neutral density of Cl is updated, and the control model for the neutral density of Cl and the flow rate of $Cl_2$ is updated. More details on how to optimize the recipe will be discussed in FIG. 2.

After Step S160, the method 100 goes back to Step S130 and then moves forward to Step S140. Firstly, the plasma process is performed according to the recipe that has just been optimized. Secondly, the wafer characteristic is measured. Thirdly, if the wafer characteristic (newly measured) is within the predetermined range, the method 100 proceeds to Step S199 and ends therein. Otherwise, Steps S150, S160, S130 and S140 are repeated until the wafer characteristic falls within the predetermined range.

Figure 2:
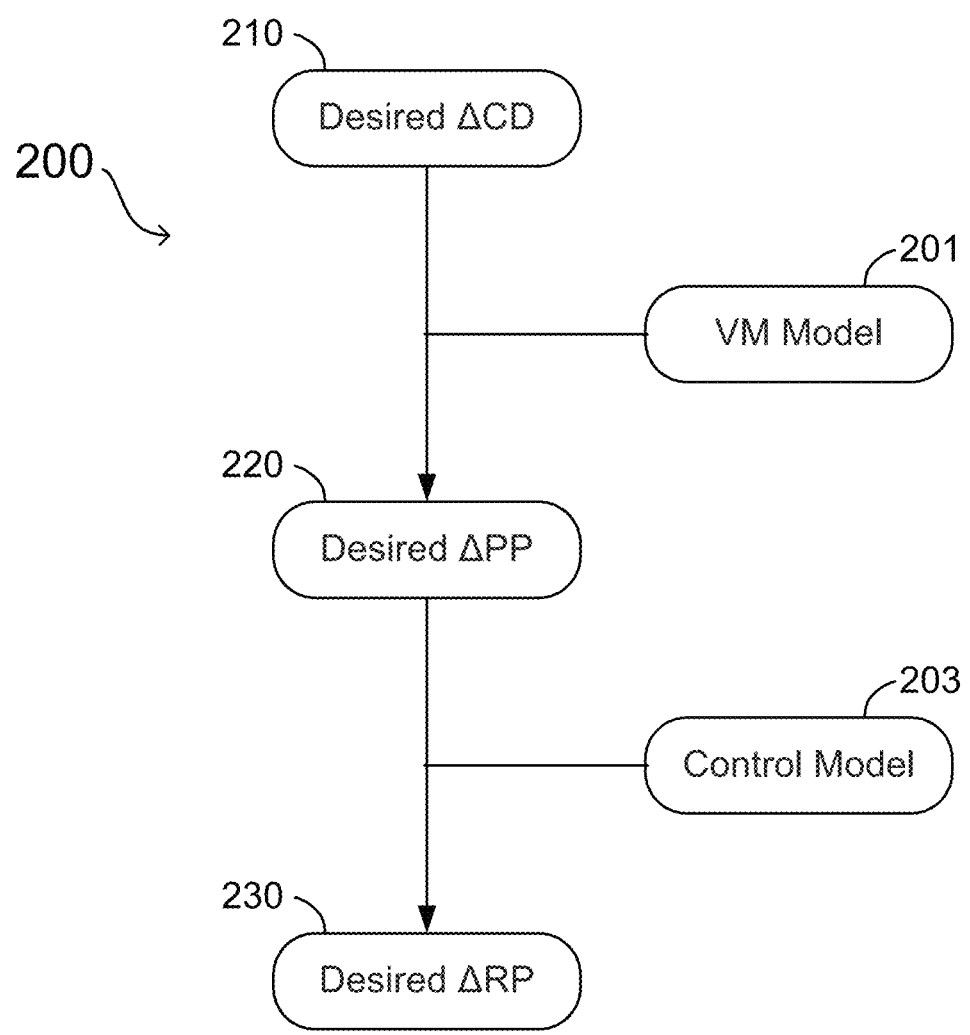
FIG. 2 shows a diagram of optimizing a recipe parameter of a recipe for a plasma process, in accordance with some embodiments of the present disclosure.

FIG. 2 shows a diagram of a method 200 for optimizing a recipe parameter of a recipe for a plasma process, in accordance with some embodiments of the present disclosure. In some embodiments, the method 200 includes Bayesian optimization. In some embodiments, FIG. 2 corresponds to Step S160 in FIG. 1.

In the primary embodiment, the wafer characteristic of interest is CD. Accordingly, $\Delta CD$ is calculated first: $\Delta CD = CD_{Measured} - CD_{target}$. Herein, $CD_{Measured}$ is CD measured after performing the plasma process, and $CD_{Target}$ is a target value of CD. Thus, $\Delta CD$ is also referred to as desired $\Delta CD$ 210. Next, $\Delta PP$ (also referred to as desired $\Delta PP$ 220) is calculated: $\Delta PP = PP_{Updated} - PP_{Current}$. $PP_{Updated}$ is an updated value of the plasma parameter based on the wafer characteristic (e.g. $CD_{Measured}$) using a VM model 201, and $PP_{Current}$ is a current value of the plasma parameter. In a non-limiting example, the plasma parameter is the aforementioned neutral density of Cl. Subsequently, $\Delta RP$ (also referred to as desired $\Delta RP$ 230) is calculated: $\Delta RP = RP_{Updated} - RP_{Current}$. $RP_{Updated}$ is an updated value of the recipe parameter based on $PP_{Updated}$ using a control model 203, and $RP_{current}$ is a current value of the recipe parameter. In a non-limiting example, the recipe parameter is the flow rate of $Cl_2$. Finally, the recipe is updated by using $\Delta RP$ ($RP_{Updated} = RP_{Current} \Delta RP$.

In some embodiments, a wafer characteristic other than CD is important for the plasma process. Similarly, $\Delta WC$ is calculated: $\Delta WC = WC_{Measured} - WC_{target}$. Herein, $WC_{Measured}$ is the wafer characteristic measured after performing the plasma process, and $WC_{Target}$ is a target value of the wafer characteristic.

In some embodiments, $\Delta CD$, $\Delta PP$ and $\Delta RP$ need not be calculated. Instead, $CD_{Measured}$ is directly compared with the aforementioned pre-determined range. $PP_{Updated}$ is calculated based on $CD_{Measured}$ using the VM model 201, and $RP_{Updated}$ is calculated based on $PP_{Updated}$ using the control model 203. Finally, the recipe is updated by directly using $RP_{Updated}$ in lieu of $RP_{Current}$.

In some embodiments, multiple plasma parameters and multiple recipe parameters are updated or optimized. In some embodiments, multiple wafer characteristics are of interest, such as CD, ER, an amount of remaining mask material and the like. Optimizing all the wafer characteristics individually in succession or simultaneously at once may not be necessary when the method 100 and the method 200 are applied. As a matter of fact, optimizing one of the wafer characteristics, such as CD, can naturally or automatically optimize other wafer characteristics, thereby enabling multi-objective optimization.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method of optimizing a recipe for a plasma process, comprising:
   (a) building a virtual metrology (VM) model that predicts a wafer characteristic resulting from the plasma process based on a plasma parameter;
   (b) building a control model that describes a relationship between the plasma parameter and a recipe parameter;
   (c) measuring the wafer characteristic after performing the plasma process according to the recipe;
   (d) determining whether the wafer characteristic is within a predetermined range;
   (e) calibrating the VM model and the control model based on the wafer characteristic;
   (f) optimizing the recipe by updating the plasma parameter based on the wafer characteristic using the VM model and updating the recipe parameter based on the plasma parameter using the control model; and
   (g) repeating (c), (d), (e) and (f) until the wafer characteristic is within the predetermined range,
   wherein calibrating the control model comprises:
   performing the plasma process on a dummy wafer according to the recipe;
   recording the plasma parameter while performing the plasma process on the dummy wafer according to the recipe; and
   updating the control model based on the plasma parameter recorded.

2. The method of claim 1, wherein determining whether the wafer characteristic is within the predetermined range further comprises determining whether $\Delta WC$ exceeds a pre-determined threshold, wherein:

$$\Delta WC = WC_{Measured} - WC_{target},$$

$WC_{Measured}$ is the wafer characteristic measured after performing the plasma process, and $WC_{Target}$ is a target value of the wafer characteristic.

3. The method of claim 2, wherein optimizing the recipe further comprises determining $\Delta PP$ using the VM model, wherein:

$$\Delta PP = PP_{Updated} - PP_{Current},$$

$PP_{Updated}$ is an updated value of the plasma parameter based on $WC_{Measured}$ using the VM model, and
$PP_{Current}$ is a current value of the plasma parameter.

4. The method of claim 3, wherein optimizing the recipe further comprises determining $\Delta RP$ using the control model, wherein:

$$\Delta RP = RP_{Updated} - RP_{Current},$$

$RP_{Updated}$ is an updated value of the recipe parameter based on $PP_{Updated}$ using the control model, and
$RP_{Current}$ is a current value of the recipe parameter.

5. The method of claim 1, wherein the control model is calibrated periodically.

6. The method of claim 1, wherein optimizing the recipe comprises performing Bayesian optimization.

7. The method of claim 1, wherein building the VM model comprises performing a linear regression.

8. The method of claim 1, further comprising measuring the plasma parameter using an in-situ sensor in a plasma tool.

9. The method of claim 1, wherein the plasma process comprises at least one of an etching process, a chemical vapor deposition process, a physical vapor deposition process or an atomic layer deposition process.

10. The method of claim 1, wherein the wafer characteristic comprises at least one of a critical dimension (CD), an etch rate (ER), an amount of remaining mask material, a film thickness, a film chemical composition, a film deposition rate, a film reflectivity or a film absorbance.

11. The method of claim 1, wherein the plasma parameter comprises at least one of gas pressure, gas temperature, species concentration, etchant flux, deposition flux, by-product re-deposition rate, a sticking coefficient, ion flux or ion energy.

12. The method of claim 1, wherein the recipe parameter comprises at least one of gas flow rate, plasma chemistry, microwave power or electrostatic chuck temperature.

13. The method of claim 1, wherein optimizing one wafer characteristic that results from the plasma process automatically leads to optimization of another wafer characteristic that results from the plasma process.

14. The method of claim 1, wherein the plasma parameter depends on the recipe parameter and a chamber condition.

15. The method of claim 14, wherein the chamber condition comprises at least one of a surface condition and age of a component of a plasma tool.

16. The method of claim 15, wherein
the surface condition comprises species coverage on a chamber wall, and
the age of the component of the plasma tool comprises chamber age.

17. The method of claim 1, wherein:
the wafer characteristic comprises at least one of a critical dimension (CD), an etch rate (ER), an amount of remaining mask material, a film thickness, a film chemical composition, a film deposition rate, a film reflectivity or a film absorbance,
the plasma parameter comprises at least one of gas pressure, gas temperature, species concentration, etchant flux, deposition flux, by-product re-deposition rate, a sticking coefficient, ion flux or ion energy, and
the recipe parameter comprises at least one of gas flow rate, plasma chemistry, microwave power or electrostatic chuck temperature.

18. A method of optimizing a recipe for a plasma process comprising:
(a) building a virtual metrology (VM) model that predicts a wafer characteristic resulting from the plasma process based on a plasma parameter;
(b) building a control model that describes a relationship between the plasma parameter and a recipe parameter;
(c) measuring the wafer characteristic after performing the plasma process according to the recipe;
(d) determining whether the wafer characteristic is within a predetermined range;
(e) calibrating the VM model and the control model based on the wafer characteristic;
(f) optimizing the recipe by updating the plasma parameter based on the wafer characteristic using the VM model and updating the recipe parameter based on the plasma parameter using the control model; and
(g) repeating (c), (d), (e) and (f) until the wafer characteristic is within the predetermined range, wherein
the plasma process is an etching process,
the wafer characteristic measured is CD,
the plasma parameter comprises neutral density of Cl, and
the recipe parameter comprises a flow rate of $Cl_2$.

19. The method of claim 18, wherein:
the VM model predicts CD using the neutral density of Cl, and
the control model describes a relationship between the neutral density of Cl and the flow rate of $Cl_2$.

20. The method of claim 19, wherein optimizing CD automatically leads to optimization of ER.

* * * * *